United States Patent
Dudman

(10) Patent No.: US 8,662,886 B2
(45) Date of Patent: Mar. 4, 2014

(54) SYSTEM FOR IMPROVED PRESSURE CONTROL IN HORIZONTAL DIFFUSION FURNACE SCAVENGER SYSTEM FOR CONTROLLING OXIDE GROWTH

(75) Inventor: Miles Dudman, Mountain View, CA (US)

(73) Assignee: Micrel, Inc., San Jose, CA (US)

( * ) Notice: Subject to any disclaimer, the term of this patent is extended or adjusted under 35 U.S.C. 154(b) by 1614 days.

(21) Appl. No.: 11/938,438

(22) Filed: Nov. 12, 2007

(65) Prior Publication Data
US 2009/0176181 A1    Jul. 9, 2009

(51) Int. Cl.
*A01H 5/02*    (2006.01)
(52) U.S. Cl.
USPC ............ 432/93; 432/24; 432/41; 432/47; 118/715; 118/724; 219/679; 219/686; 219/687; 438/439; 438/770; 438/773; 438/787
(58) Field of Classification Search
None
See application file for complete search history.

(56) References Cited

U.S. PATENT DOCUMENTS

| | | | | |
|---|---|---|---|---|
| 4,256,052 A * | 3/1981 | Johnson et al. | ............... | 118/719 |
| 4,282,825 A * | 8/1981 | Nagatomo et al. | ............... | 118/58 |
| 4,328,261 A * | 5/1982 | Heinecke et al. | ............. | 438/681 |
| 4,543,059 A * | 9/1985 | Whang et al. | ................... | 432/11 |
| 4,992,044 A * | 2/1991 | Philipossian | ................ | 432/253 |
| 5,728,602 A * | 3/1998 | Bellows et al. | ................ | 438/14 |
| 5,777,300 A * | 7/1998 | Homma et al. | ............... | 219/679 |
| 5,883,919 A * | 3/1999 | Hung et al. | ................... | 373/112 |
| 6,936,108 B1 * | 8/2005 | Saito | ............................ | 118/715 |
| 7,427,571 B2 * | 9/2008 | Lindeboom et al. | .......... | 438/758 |
| 7,455,734 B2 * | 11/2008 | Yamaguchi et al. | .......... | 118/728 |
| 7,749,918 B2 * | 7/2010 | Oosterlaken et al. | ......... | 438/770 |

* cited by examiner

*Primary Examiner* — Zandra Smith
*Assistant Examiner* — Khanh Duong
(74) *Attorney, Agent, or Firm* — Sawyer Law Group, P.C.

(57) ABSTRACT

The present invention relates generally to semiconductor wafer fabrication and more particularly but not exclusively to advanced process control methodologies for controlling oxide formation using pressure. The present invention, in one or more implementations, includes a pressure stabilization system to dynamically adjust scavenger pressure in a furnace during wafer fabrication in relation to a pressure formation range, value, or one or more pressure indicators in a wafer fabrication process.

4 Claims, 7 Drawing Sheets

Load Station

SYSTEM FOR IMPROVED PRESSURE CONTROL IN HORIZONTAL DIFFUSION FURNACE SCAVENGER SYSTEM FOR CONTROLLING OXIDE GROWTH

FIELD OF THE INVENTION

The present invention relates generally to semiconductor wafer fabrication and more particularly but not exclusively to advanced process control methodologies for controlling oxide formation using pressure.

BACKGROUND OF THE INVENTION

Demand for semiconductors, wafers, integrated circuits and semiconductor devices (i.e., collectively "semiconductors") continues to rapidly increase. With the continued market demand, there remain market pressures to increase the number of wafers that can be processed, reduce the geometries of finished wafers and their associated chip footprints, and increase component counts in the reduced geometries. Being able to sustain and meet the market demands with a reliable and consistent offering is a challenge however, in part because wafer manufacture is an environment that is both process sensitive and equipment intensive.

The fabrication of wafers (i.e., fabrication, fab, or fab environment) requires advanced processing equipment, unique toolings and extensive research efforts. Process tools (i.e., toolings) in these environments may often run in parallel or have multiple components to produce similar products (i.e., yields or outputs). Yet these same process tools, even when of the same manufacturer or source, may have unique variances in their individual performances which may create substantial or measurable differences in the quality of the products produced if unaccounted for.

A process tool may include a furnace, a furnace having a plurality of chambers, a furnace bank, a furnace tube, a processing chamber in which a wafer is acted upon, a processing activity point in a fab line where a wafer may be received or acted upon, and the like. In other aspects, a process tool may further include a controller or control mechanism for controlling a process tool and the tool's acts or actions with respect to the fab activity, in response to one or more commands, instruction sets, hardware or software commands, or other control-based directions of the controller.

More particularly, a process tool may involve a horizontal diffusion furnace scavenger system (also included within the term used herein as "furnace" and used specifically as "horizontal furnace").

FIG. 1A depicts an example of a typical wafer 100 produced by a process tool, such as horizontal furnace, in an established process. In FIG. 1A, the wafer 100 has elements which may vary with respect to the type of process tooling and fab process undertaken in its manufacture, including a substrate 120 and a memory cell area 130. A memory cell often includes two or more field oxide areas (i.e., isolation regions) 110 which are often grown areas of oxide formed by a local oxidation of silicon (LOCOS) process.

The LOCOS process is in effect an isolation scheme commonly used in metal oxide semiconductors (MOS) and complementary MOS (CMOS) technology in which a thick pad of thermally grown SiO2 separates adjacent devices such as P-channel MOS and N-channel MOS transistors. Local oxidation is often accomplished by using silicon nitride to prevent oxidation of silicon in predetermined areas, and silicon is typically implanted between a silicon nitride region to form channel stops.

From FIG. 1A, the memory cell 130 is formed above an active area 140 of the substrate 120 and is situated typically between the adjacent field isolation regions 110. The memory cell 130 typically comprises a gate insulation layer 135 (i.e., tunnel oxide layer), a floating gate electrode 145 (often of polysilicon), a composite inter-poly insulation layer 150, and a control gate electrode 160 (often of polysilicon). In many implementations of the example of FIG. 1A, the insulation layer 150 is also known as an oxide-nitride-oxide (ONO) layer as it is often comprised of a layer of silicon dioxide 151, a layer of silicon nitride 152 and a layer of silicon dioxide 153, though other variations are also known.

From FIG. 1A, the thickness and dielectric constants of the floating gate electrode 135 and the layers of each of the ONO layer (i.e., 151, 152 and 153) may affect the overall performance of the memory cell and the associated integrated or electronic circuitry, depending on their thickness and formation details. Similarly there are also other characteristics of the memory cell related to physical structures, thickness, conductivity, uniformity, capacitance, band voltage, resistance, and growth impacts due to temperature and/or pressure during the deposition process, which may affect performance which directly results from a process tool's operation on the wafer (i.e., collectively "performance variables," "performance variances" or "performance characteristics").

In a traditional furnace or furnace bank, there may exist more than one furnace tube in which a predetermined number of furnace tubes perform a similar process. FIG. 1B depicts a typical eight-tube furnace bank arrangement 190.

By example, the furnace bank of FIB. 1B is a process tool having two four-furnace banks at 191a and 191b, totaling eight similar separate tubes (i.e., furnace tubes) (191a, 191b, 191c, 191d, 191e, 191f, 191g, and 191h), each arranged to perform a furnace-based activity on a wafer set in the fab process. In a typical arrangement 190, each tube is arranged to receive a set of silicon wafers (192a, 192b, 192c, 192d, 192e, 192f, 192g, and 192h) which are typically received by the respective tube of the arrangement 190. In FIG. 1B, by example, wafer set 192h is about to be received into the proper bay area of furnace tube 191h, while all other wafer sets have been properly positioned in their respective tube bay. At 193a, 193b, 193c, 193d, 193e, 193f, 193g, and 193h are controllers each of which controls its respective furnace tube along 194a or 194b. Both pressure and heat source are integral features of a typical furnace (not shown). Once the wafers are inserted into the their respective tubes, the wafers are acted upon in accordance with the designated process, and thereafter removed. Once removed, yield variations of the wafers may be determined and compared.

FIG. 2 depicts a typical horizontal diffusion furnace scavenger system 200 for a particular process. In FIG. 2, by example, the horizontal furnace 200 is designed to perform Diffusion/Atmospheric and Low Pressure Chemical Vapor Deposition (LPCVD) processing on predetermined wafers of a particular range of sizes. The Example configuration of FIG. 2 is referred to as a right-handed system, as determined in relation to the position of the furnace with regard to an operator. The horizontal furnace includes a load station at 210 in which wafers are loaded for travel into the furnace portion 220 of the horizontal furnace for processing. A gas cabinet provides associated gases for furnace processing at 230. A power system provides power and control logic to the system at 240. Operatively, once the wafers are fully processed, the wafers are removed from the furnace and returned to the load station.

FIG. 3 depicts a more detailed view of a load station 300 in a particular arrangement for loading wafers into an associated four-tube furnace bank (not shown). From FIG. 3, wafers depicted at 310 are being readied for loading into an associated furnace tube (not shown) of a furnace bank. Wafers 310 are situated on a furnace paddle 320 in a predetermined arrangement in relation to the associated furnace tube. A boat loader 330 is arranged with the furnace paddle to horizontally push or pull the furnace paddle with the wafers into or out of the associated furnace tube. The boat loader is mechanically and controllably arranged to traverse a predetermined portion of the load station into the associated furnace tube, generally close or reduce interface access between the loading station and the associated furnace tube by positioning a sealing door 340 in proximity to an interface near the furnace tube outer wall at 350, await completion of processing of loaded wafers, and in response to control logic (not shown), remove the processed wafers from the furnace into the loading station. The boat loader also includes a secondary door at 360. The process may be often repeated for further wafer processing.

Additionally, from FIG. 3, a boat loader 335, in association with a further furnace tube (not shown) of the furnace bank, has traversed its predetermined portion of the load station, reduced the interface access 370 between the loading station and the associated furnace tube by positioning its sealing door in proximity to an interface near the furnace tube outer wall. Further, to prevent particles on the wafers during the loading process, it is understood that a constant horizontal laminar flow from the load station into an external environment, such as a cleanroom, be provided to create filtered air inside the loading station.

FIG. 4 depicts detail of a further example of a furnace and scavenger system 400 for wafer fabrication. In FIG. 4, a boat loader assembly, controlled by a controller 411, is arranged with a boat loader 410, furnace paddle 415, a sealing door 420 and a quartz door 430 for providing wafers 440 into a furnace tube 450. As depicted, by example, in FIG. 4, the wafers 440 are completely inserted to a predetermined position within the furnace tube by the boat loader assembly. The scavenger area 460 exhausts gases from the furnace, resident in the area, and the gases are externally exhausted at 470 from the system, often by an external fan or exhausting system. Operationally, the controller 411 controls the loading and unloading of the wafers 440 into the furnace tube 450 by the boat loader assembly, resulting in a sealing gap 480 as between the sealing door 420 and the furnace/scavenger area 460.

FIG. 5 depicts a typical operational oxidation cycle 500 for wafer fabrication using a furnace system. From FIG. 5, a process is started at 510 in which wafers are first loaded onto a paddle arranged for loading at 520. The furnace system is often programmed for a specific processing recipe at 525 and the loaded wafers are inserted into a furnace tube by the boat loader assembly at 530. Once the wafers are completely inserted into the furnace tube, in accordance with the recipe, processing begins and predetermined temperatures are established by the furnace at 535.

Once temperatures reach a first established level, temperature ramping often occurs at 542 in which the furnace tube temperature is varied in accordance with a temperature cycle predetermined by the recipe, (e.g., 875-1200° C.). Further process gases (i.e., nitrogen, oxygen, etc.) are introduced at 544 in accordance with recipe and act upon the wafer at a predetermined time in the process cycle at a predetermined temperature. These two steps result in the creation of exhaust gases which are then removed from the process to an external environment by the scavenger system 540.

At a predetermined time, the process begins the final steps of completion where the gases cease flowing at 545 and the temperature of the furnace is reduced at 550. Once completed, the boat loader assembly returns to a load/unload position at 560 and the finished wafers, processed in accordance with the recipe, may be removed at 570. The boat loader assembly then may continue operations or stop operations at 580. At 580, the boat loader assembly is either readied for another wafer batch for processing at 585 and a process begins again at 510, or the boat loader assembly is not placed into further processing sequences at 590. The block at 544 depicts where the primary oxide growth period occurs during typical wafer fabrication processes.

In many implementations, the boat loaders are automatically controlled in their operation by a digital process controller (DPC) or similar. The boat loader assembly, operationally, is often speed-controlled and driven by a servo-styled motor to limit vibration as the boat loader traverses the predetermined path. In other implementations, the boat loaders are mechanically different than those depicted in the Figures, but comprise in one or another a sealing door, a paddle, and a mechanism for delivery of the wafers into a furnace area. Collectively, such implementations are referred to herein as "boat loaders."

Unfortunately, variances in the yield (e.g., produced semiconductor or memory cell) often occur even with preprogrammed furnace systems, where variances in temperatures, pressures, and other processing variants occur thereby affecting the oxide characteristics of the yield. Some of the yield variances can be determined in the produced wafer's film thickness, stress, and dopant percentages, each of which is also directly associated with predictable comparative performances of the produced wafer. As many of these processes are automated and include high capacity productions, the variance resulting can produce sizeable yield variances which are not acceptable.

One attempted solution is to vary times for furnace oxidation sequences where the oxidation time is varied for the same single recipe, across furnaces. However, even with this approach, different oxidation times yield wafers having differing oxide characteristics as oxide results are directly dependent on processing characteristics resulting in different rates of growth. This attempted approach also does not account for variance due to environmental and other surrounding effects.

For instance, the traditional approaches are further limited by the programmed or fixed approach of the production process where dynamic factors (such as neighboring furnace tubes and systems, air flow patterns, and temperature effects of opened and closed systems proximate thereto) are not accounted for. As a result, processing characteristics are not effectively managed and dynamically controlled, resulting in yields having performance characteristics that are different than what had been desired.

Therefore, optimally producing high-quality products in a fabrication (i.e., "fab") environment yielding oxide consistency in produced wafers, and fewer performance variances in process steps, is desired. Additionally, limiting such performance variances commonly across a set of equipment within furnace systems and fab environments, and improving consistency in yield output for similar-functioning but different process systems in a fab environment, is also needed. Further, it is highly is desired to be able to predictably coordinate differing line systems to develop consistency in process controls for oxide thickness control and particularly that of gate oxides.

The present invention, in accordance with its various implementations herein, addresses such needs.

SUMMARY OF THE INVENTION

In one implementation of the present invention, a pressure stabilizing system for wafer fabrication processing using a horizontal diffusion furnace, comprising: a wafer loading system, a horizontal diffusion furnace capable of operation for a predetermined recipe with the wafer loading system, a pressure stability control system and an exhaust release system capable of releasing exhaust gas from the furnace, is set forth.

In another implementation, the present invention is an adaptive pressure feedback assembly for a horizontal diffusion furnace and loading system capable of wafer fabrication processing, comprising: one or more pressure sensors, a communication logic providing for a capability of communication between the one or more pressure sensors and a controller of the system, and an interface to the controller of the system.

In a further implementation, the present invention is a method of stabilizing pressure for improving oxide formation control in a wafer production process having a horizontal diffusion furnace, the method comprising: determining a formation pressure value, measuring scavenger pressure during the process, and horizontally adjusting a sealing door from a first position to a second position to augment air flow into and actual pressure of the first area in relation to the measured scavenger pressure and the formation pressure value.

In a further implementation, the present invention is a process of stabilizing pressure for improved oxide formation control for a recipe in a wafer fabrication process having a horizontal furnace, the process comprising: providing one or more wafers for processing, processing the one or more wafers in accordance with the recipe, horizontally adjusting a sealing door of a wafer loading assembly from a first position to a second position to augment air flow into and actual pressure of the first area, and removing the one or more processed wafers from the wafer loading assembly at a predetermined time.

In still a further implementation, the present invention is a computer program product for controlling a process of stabilizing pressure for improved oxide formation control for a recipe in a wafer fabrication process using the method of the present invention in one or more implementations.

DETAILED DESCRIPTION

The present invention relates generally to semiconductor wafer fabrication and more particularly but not exclusively to advanced process control methodologies for controlling oxide formation using pressure.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

As used herein, the term "furnace," whether singular or plural, is intended to include tools and equipment in the semiconductor fabrication process, without limitation, such as diffusion furnaces, atmospheric diffusion furnaces, low-pressure chemical vapor deposition (LPCVD) poly and nitride systems, and plasma-enhanced chemical vapor deposition (PECVD) systems. Further, a furnace, in an implementation of the present invention, may comprise equipment or tooling of a process and an associated controller for controlling the action of the tool, the loading mechanism, a program, other equipment, or a combination thereof.

Figure 1A:
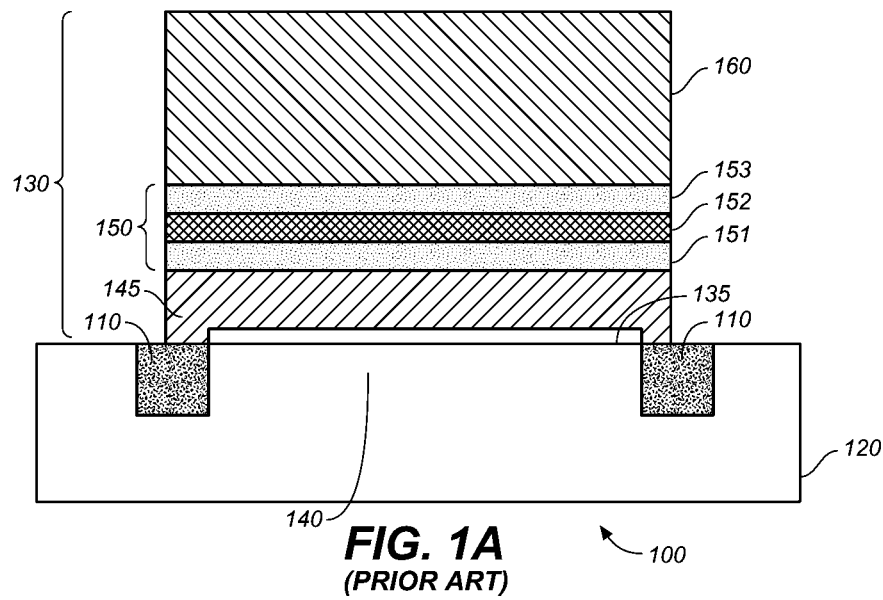
FIG. 1A depicts an example of a typical wafer produced by a process tool, such as horizontal furnace, in an established process.
Figure 1B:
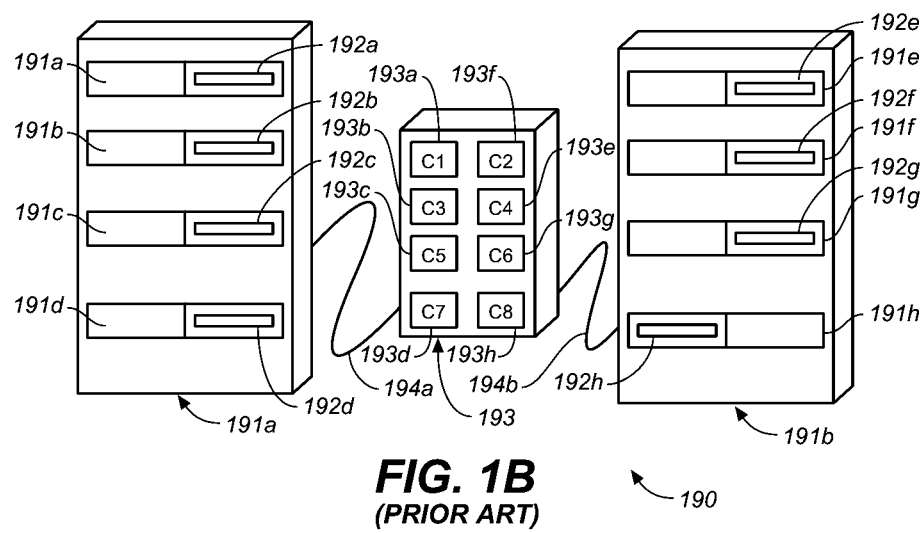
FIG. 1B depicts a typical eight tube furnace bank arrangement.
Figure 2:
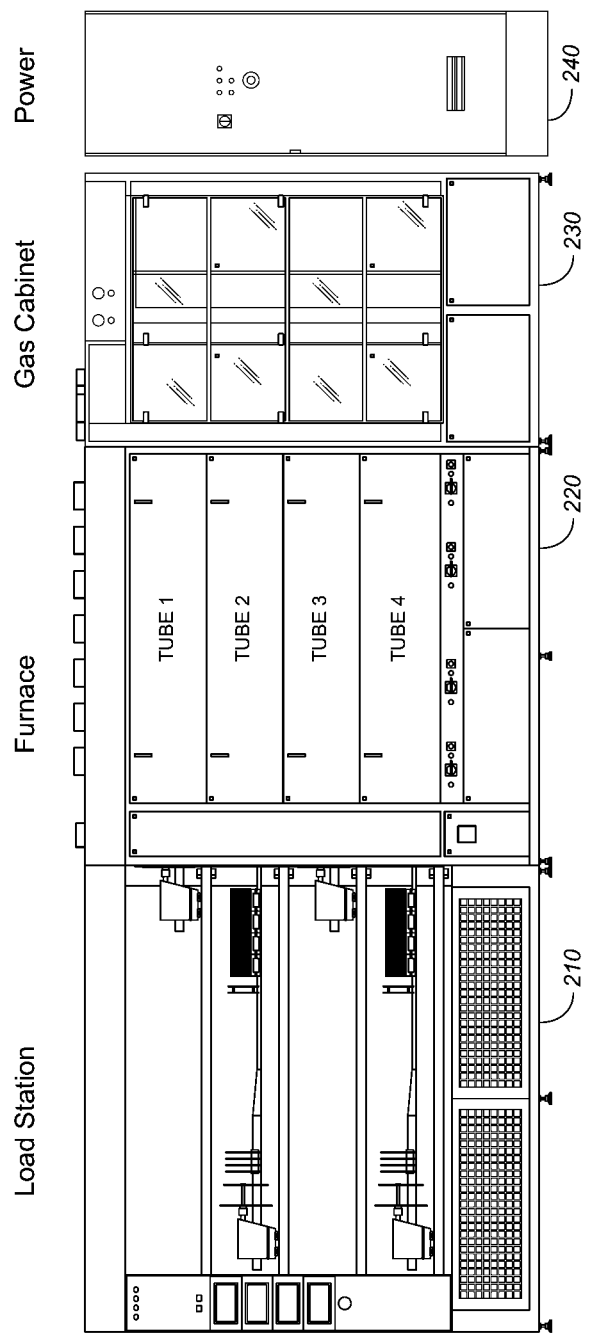
FIG. 2 depicts a typical horizontal diffusion furnace scavenger system for a particular process.
Figure 3:
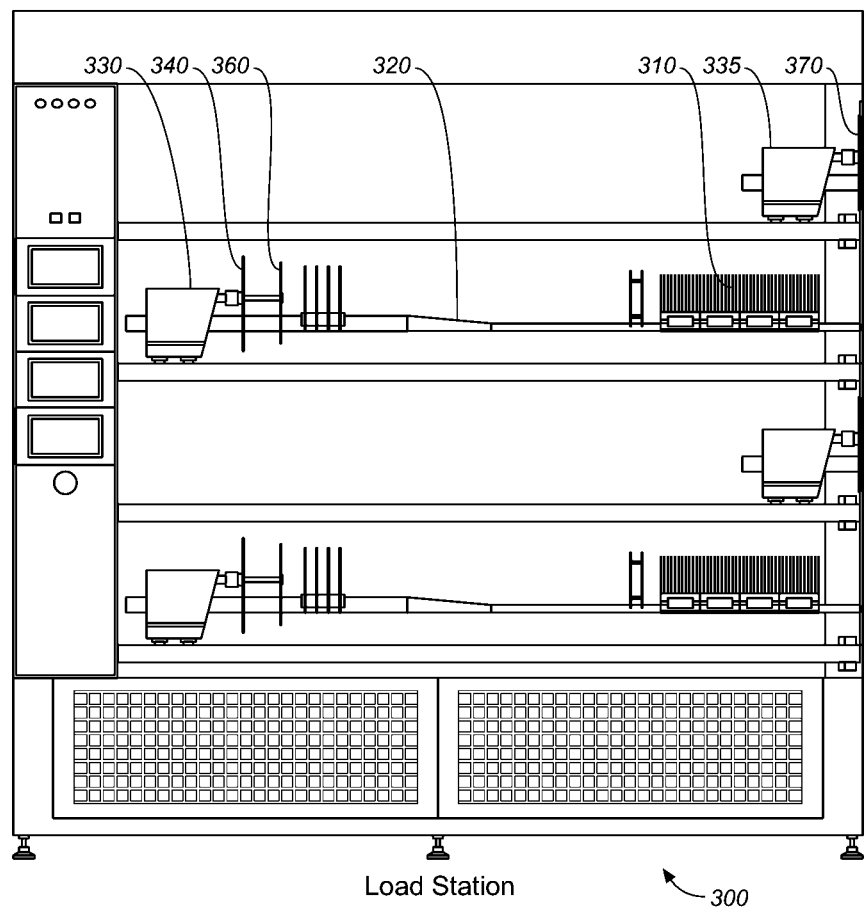
FIG. 3 depicts a more detailed view of a load station in a particular arrangement for loading wafers into an associated four-tube furnace bank.
Figure 4:
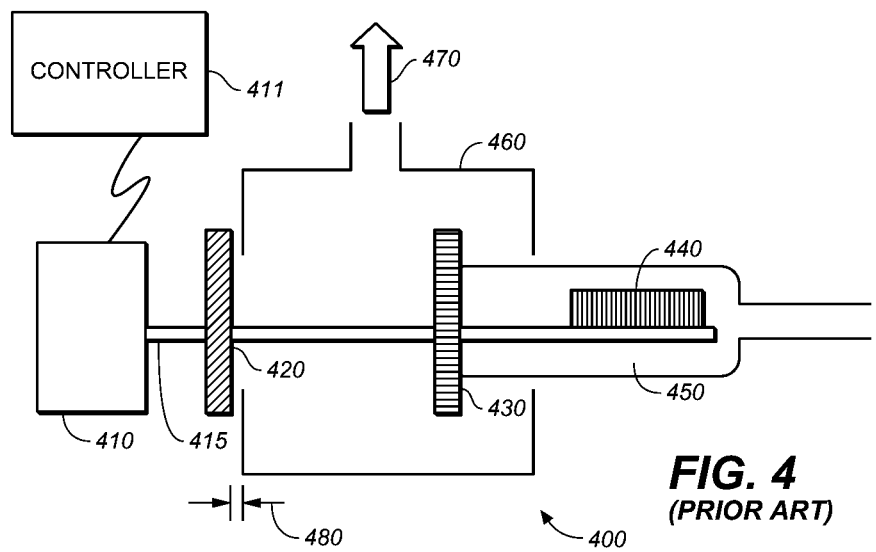
FIG. 4 depicts detail of a further example of a furnace and scavenger system 400 for wafer fabrication.
Figure 6:
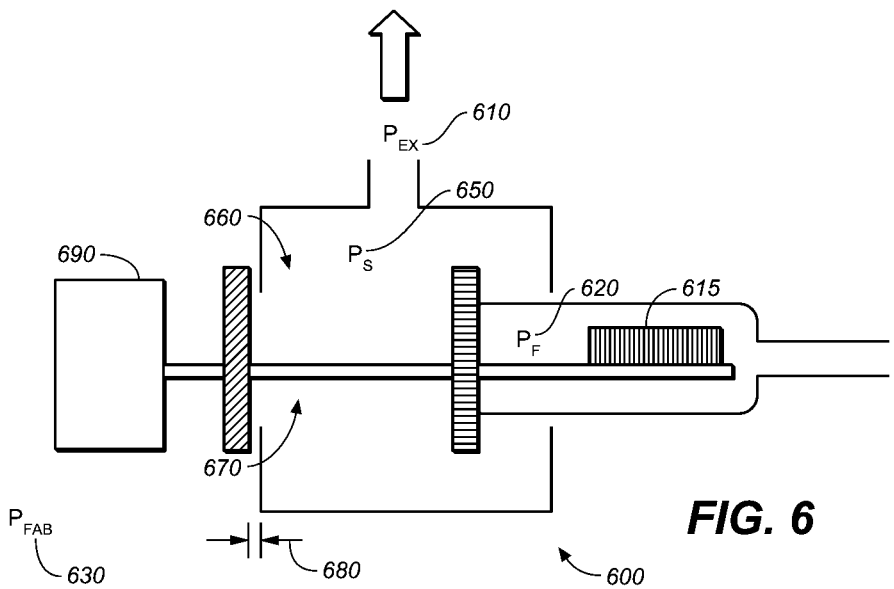
FIG. 6 depicts various pressures involved in an analysis of a typical furnace example, such as that of FIG. 4, involving a scavenger exhaust area, in accordance with an implementation of the present invention.
Figure 5:
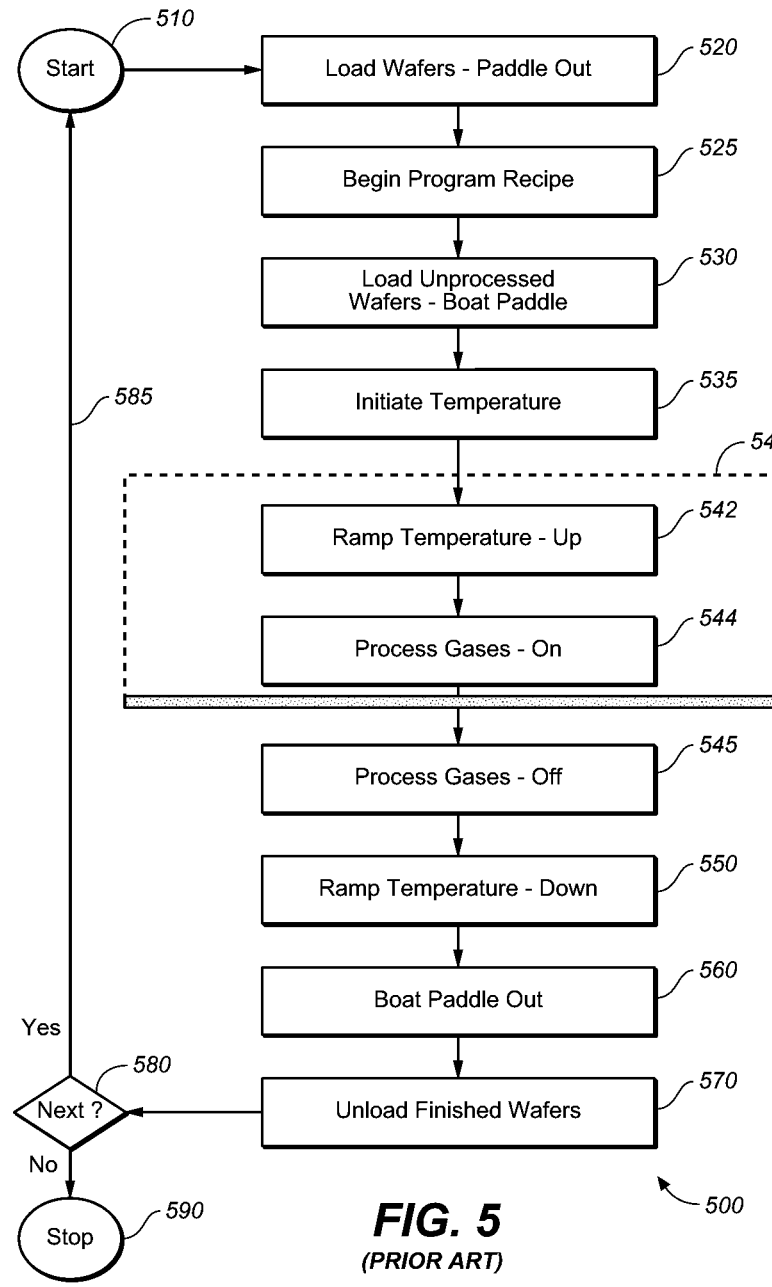
FIG. 5 depicts a typical operational oxidation cycle for wafer fabrication using a furnace system.

FIG. 6 depicts various pressures involved in an analysis of a typical furnace example, such as that of FIG. 4, involving a scavenger exhaust area 600, in accordance with an implementation of the present invention. From FIG. 6, an exhaust pressure ($P_{EX}$) of the exhaust gas leaving the scavenger area is depicted at 610; a furnace pressure ($P_F$) of the gases acting upon the wafers 615 is depicted at 620; a fabrication pressure of the general fabrication area ($P_{FAB}$) is depicted at 630; general atmospheric pressure ($P_{ATM}$) is depicted at 640; and the pressure in the scavenger area ($P_S$) is depicted at 650. Air flow arranged to be incoming into the scavenger area, or first area of the furnace, is set forth at 660 and 670. The amount of resistive air flow available to enter the scavenger area is in relation to the width of the sealing gap at 680, which is determined by the position of the boat loader 690. It has been further observed that a sealing gap width of approximately one centimeter (1 cm.) is typical in traditional approaches and it is necessary to maintain an opening of the sealing gap for resistive air flow in the process.

Operationally, it has been evaluated that in one or more preferred implementations of the present invention, $P_{FAB}$ is at least slightly greater than $P_{ATM}$ so air within the fabrication environment is positive pressurized to remove dirt and dust away from the processing area. Often laminar air equipment can assist in this process. Further, since $P_{EX}$ is negatively pressurized as it is removing exhaust gas from the process, often by a remote fan or scrubbing system, $P_S$ is less than $P_{FAB}$ and $P_{ATM}$.

Further since oxide growth is a function of the furnace pressure PF, in addition to other factors, it has been further determined that the pressure within the scavenger directly affects the furnace pressure. For instance, since furnaces comprise multiple furnace tubes which may operate varied processes at differing times from one another, it has been observed that an opening of one completed process of a first furnace tube may cause heated air and therefore higher pressured air flow to result into an other furnace tube adjacent to the first furnace tube. Similarly, as furnaces usually have a common collective exhausting system, the exhaust pressure of an individual furnace tube may be affected by the collective exhaust system activating or deactivating, or by the exhaust pressure resulting from exhausting activity of other furnace tubes collectively a part thereof.

To overcome the limitations of the previous attempts and in view of the observances undertaken, the present invention, in one or more implementations includes a pressure stabilization system to dynamically adjust scavenger pressure in relation to a pressure formation range, predetermined pressure recipe value, one or more pressure indicators in a process, or a combination thereof.

In accordance with one or more implementations of the present invention, operationally it is desirable to have a fabrication process using a horizontal diffusion furnace to be arranged such that: $P_{EX}$ is less than $P_{FAB}$; $P_F$ is greater than $P_S$; $P_{FAB}$ is slightly greater than $P_{ATM}$; $P_S$ is less than $P_{ATM}$; and $P_S$ is slightly less than $P_{FAB}$. Preferably, $P_{FAB}$ is approximately 0.1" water greater than $P_{ATM}$ and $P_S$ is 0.1" to 0.3" water less than $P_{ATM}$, although such is not required.

Figure 7:
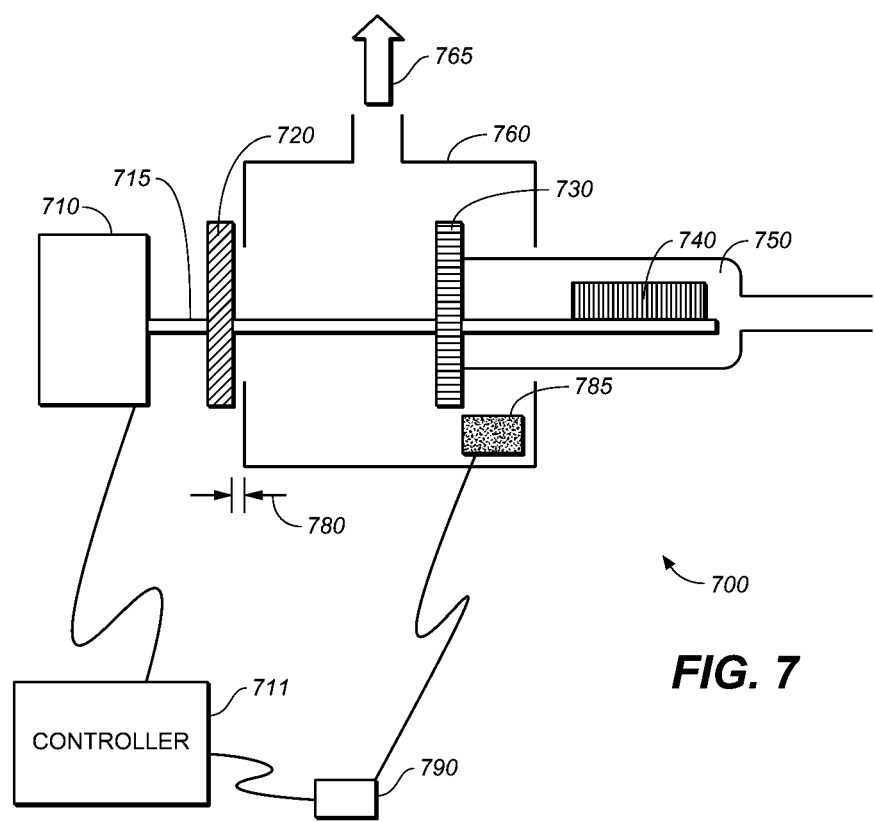
FIG. 7 depicts an implementation of the present invention in which a wafer loading assembly and a pressure stability system are controlled; and, FIG. 8 depicts an operational process flow for wafer fabrication using a furnace system in accordance with an implementation of the present invention.

FIG. 7 depicts an implementation 700 of the present invention in which a wafer loading assembly and a pressure stability system are controlled. From FIG. 7, a wafer loading assembly, controlled by a controller 711, is arranged with a wafer loader 710, furnace paddle 715, a sealing door 720 and a quartz door 730 for providing wafers 740 into a furnace tube 750. As depicted, by example, in FIG. 7, the wafers 740 are completely inserted to a predetermined position within the furnace tube by the boat loader assembly at a particular time. The scavenger area 760, during operation, exhausts gases from the furnace, resident in the scavenger area, and the gases are externally exhausted at 765. Operationally, the controller 711 controls the loading and unloading of the wafers 740 into the furnace tube 750 by positioning the wafer loader assembly in relation to pressure information determined from a pressure stabilization system including a pressure sensor 785 and a control logic 790, in communication with a controller for the wafer loader (for example but not necessarily restricted to 711).

In an alternate implementation, the pressure stabilization system includes a pressure sensor 785, control logic 790, an interface (not shown) and a pressure stabilization controller (not shown) apart from the wafer loader controller, in communication with a controller for the wafer loader 711.

Operationally, in an implementation of the present invention, the sealing gap width (as depicted in FIG. 7 at 780) is dynamically adjusted to be horizontally repositioned from a first location to a second location in response to signals from the controller controlling the wafer loader. Signals received from the controller are in response to control logic of the of the pressure stabilization system which receives pressure data from pressure sensors, compares the received pressure data with one or more predetermined pressure formation values or predetermined pressure formation ranges, determines corrective horizontal location adjustments for the wafer loader so as to lessen or widen the sealing gap (i.e., 780) in response, and creates instructions for repositioning the wafer loader to the determined second horizontal location. In this manner, in accordance with one or more implementations of the present invention, the scavenger pressure is controllably adjusted to provide for an environment of consistent oxide growth.

Preferably, the determination of adjustments to the horizontal location of the wafer loader occur prior to the release of process gases (i.e., primary oxide growth period), and after the temperature stabilization effort of the furnace.

In a further implementation, the second horizontal location determined by the pressure stabilization system of the present invention is within 5 millimeters of the first horizontal location.

In another implementation of the present invention, the determination of an additional horizontal location is repeated until a predetermined time resulting in the capability of adjusting the horizontal location of the wafer load and its associated sealing door a plurality (inclusive of but not limited to two, three, four or more) times.

In a further implementation of the present invention, the pressure stabilization system includes a pressure stabilization controller (not shown) apart from the wafer loader controller (such as but not limited to a microcontroller), in communication with a controller for the wafer loader 711, and one or more pressure sensors arranged in communication with a logic controller, where the pressure sensors may determine pressure values from one or more locations, inside or outside the scavenger area, fabrication area, furnace area, other environment, or combination.

Figure 8:
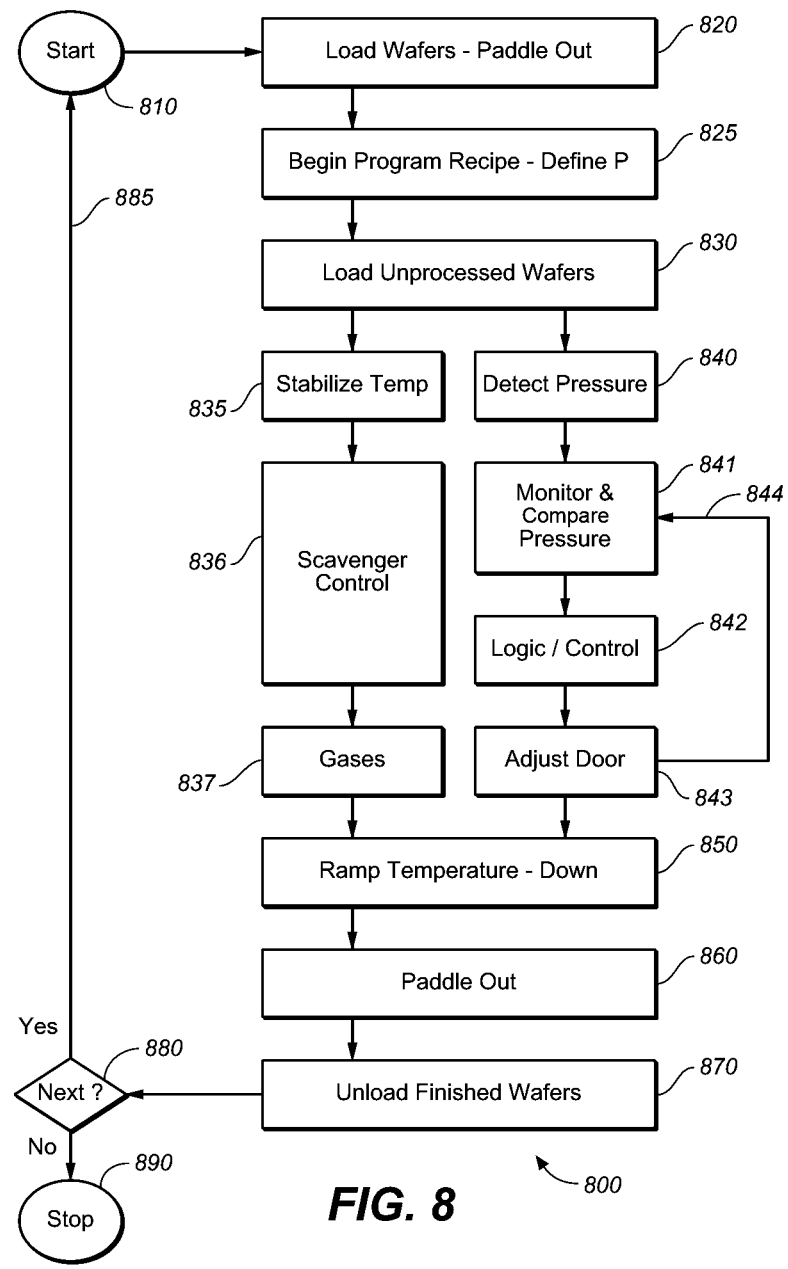

FIG. 8 depicts an operational process flow 800 for wafer fabrication using a furnace system in accordance with an implementation of the present invention. From FIG. 8, a process is started at 810 in which wafers are first loaded onto a paddle arranged for loading at 820. The furnace system may optionally be programmed for a specific processing recipe at 825 and the loaded wafers are inserted into a furnace tube of the furnace by the wafer loader assembly at 830. Once the wafers are completely inserted into the furnace tube, in accordance with the recipe, processing begins and predetermined temperatures are established by the furnace at 835.

Once temperatures reach a first established level, scavenger control is then implemented at 836, which may further include temperature ramping (varying furnace tube temperature in accordance with a temperature cycle predetermined by the recipe), pressure sensor implementation and environmental assessment of other processing factors including pressure, temperature, and time. Preferably scavenger control is implemented prior to release of process gases at 837, however the invention is not so restricted. Additionally, the pressure of the scavenger area is detected at 840.

The detection of the scavenger pressure may occur before, concurrently or after the initiation of the scavenger control 836. The detected scavenger pressure is compared with a predetermined target pressure value or predetermined formation pressure range at 841. Once compared, logic at 842 determines an adjustment to be made to the scavenger pressure based upon a horizontal relocation of the sealing door, apart of the wafer loader assembly, in relation to the furnace/scavenger area, and communicates with a controller for to indicate repositioning instructions for the wafer loader assembly. The wafer loader assembly receives the instructions at 843 and the location of the sealing door is adjusted to a second location different than the first location. Optionally, depending on the recipe and/or sequence of processing, the pressure monitoring and assessment, along with further modification to the position of the wafer loader assembly, may occur for one or more times via 844.

After the process gases (i.e., nitrogen, oxygen, etc.) have been introduced at 837 and in accordance with a predetermined time in relation to the recipe, the process begins the final steps of completion where the gases cease flowing and the temperature of the furnace is reduced at 850. Once completed, the wafer loader assembly returns to a load/unload position at 860 and the finished wafers, processed in accordance with the recipe and the present invention, may be removed at 870. The wafer loader assembly then may continue operations or stop operations at 780. At 880, the wafer loader assembly is either readied for another wafer batch for processing at 885 and a process begins again at 810, or the wafer loader assembly is not placed into further processing sequences at 890.

The present invention is further advantageous over traditional methods as no additional modifications or change-outs to existing operational equipment are required in the functional or operative nature of the fab process to which it impacts.

As used herein it will be understood that the performance of a wafer or memory cell may be impacted by one or more, or any of: film thickness, stress and dopant percentages, oxide thickness, dielectric constants of the floating gate electrode and layers of the ONO layer, physical attributes, footprint, shape, formation details, thickness, conductivity, uniformity, capacitance, band voltage, resistance, and growth impacts dues to temperature and/or pressure during the deposition process, and other characteristics which may affect performance.

As used herein, it is envisioned that the present invention in one or more implementations may be hardware, software, firmware, or combinations thereof, in its composition and operation, and may therefore further comprise software, instructional code, other applications, and be a computer program product.

Various implementations of a wafer process and methods for fabricating the wafer have been described. Nevertheless, one of ordinary skill in the art will readily recognize that various modifications may be made to the implementations, and any variations would be within the spirit and scope of the present invention. For example, the above-described process flow is described with reference to a particular ordering of process actions. However, the ordering of many of the described process actions may be changed without affecting the scope or operation of the invention. Accordingly, many modifications may be made by one of ordinary skill in the art without departing from the spirit and scope of the following claims.

What is claimed is:

1. A pressure stabilizing system for wafer fabrication processing, the system comprising:
    a wafer loading system for loading one or more unprocessed wafers into a horizontal diffusion furnace for processing having a loader for loading and unloading, wherein the wafer loading system includes a boat loader integrated with a paddle and sealing door, wherein the sealing door forms a sealing gap between the sealing door and a first area of the horizontal diffusion furnace,
    the horizontal diffusion furnace capable of operation for a predetermined recipe with the wafer loading system, a gas cabinet and a power system to process the one or more unprocessed wafers,
    a pressure stability control system having a pressure sensor in a first area of the furnace in communication with a loading controller capable of adjustably positioning a loader of the wafer loading system to a predetermined horizontal location in relation to a comparison of a measured pressure in the first area and a predetermined formation pressure range, wherein the first area is a scavenger area in the furnace, and
    an exhaust release system capable of releasing exhaust gas from the furnace.

2. The system of claim 1, wherein the sealing gap is approximately less than 2 centimeters in width.

3. The system of claim 1, wherein the predetermined horizontal location is of a distance of less than one centimeter from an original horizontal location.

4. The system of claim 3, wherein after positioning the wafer loading assembly to the predetermined horizontal location, the exhaust pressure is less than atmospheric pressure and is also less than scavenger pressure.

* * * * *